United States Patent [19]

Spratt et al.

[11] Patent Number: 5,075,241
[45] Date of Patent: Dec. 24, 1991

[54] METHOD OF FORMING A RECESSED CONTACT BIPOLAR TRANSISTOR AND FIELD EFFECT DEVICE

[75] Inventors: David B. Spratt, Plano; Robert L. Virkus, Dallas; Robert H. Eklund; Eldon J. Zorinsky, both of Plano, all of Tex.

[73] Assignee: Texas Instruments Incorporated, Dallas, Tex.

[21] Appl. No.: 542,294

[22] Filed: Jun. 22, 1990

Related U.S. Application Data

[60] Division of Ser. No. 411,208, Sep. 21, 1989, Pat. No. 4,985,744, which is a continuation-in-part of Ser. No. 149,785, Jan. 29, 1988, Pat. No. 4,897,703.

[51] Int. Cl.⁵ .................................... H01L 21/265
[52] U.S. Cl. .................................... 437/31; 437/57; 437/59; 437/203; 148/DIG. 9
[58] Field of Search .................. 437/203, 31, 57, 59, 437/56; 148/DIG. 9, DIG. 11

[56] References Cited

U.S. PATENT DOCUMENTS

| | | | |
|---|---|---|---|
| 3,969,165 | 7/1976 | Henderson | 437/203 |
| 4,529,456 | 7/1985 | Anzai | 437/57 |
| 4,539,742 | 9/1985 | Kanzaki | 437/203 |
| 4,774,204 | 9/1988 | Havemann | 437/192 |
| 4,816,423 | 3/1989 | Havemann | 437/57 |
| 4,868,135 | 9/1989 | Ogura | 437/31 |
| 4,897,703 | 1/1990 | Spratt | 437/34 |
| 4,962,053 | 10/1990 | Spratt | 437/31 |
| 4,985,744 | 1/1991 | Spratt et al. | 357/34 |

Primary Examiner—Brian E. Hearn
Assistant Examiner—Tuan Nguyen
Attorney, Agent, or Firm—Melvin Sharp; James T. Comfort; N. Rhys Merrett

[57] ABSTRACT

Disclosed is a scaled, self aligned, bipolar transistor and a method of fabrication which is compatible with MOSFET device structures. A transistor intrinsic base region is formed in the face of an isolated epitaxial region and polysilicon is deposited, patterned and etched to form emitter regions. An oxide cap and first sidewall oxide spacers are formed on the polysilicon emitters and the single crystal silicon is etched using the oxide covered emitters as a mask to form recessed regions in the epitaxial layer. The extrinsic base region is then formed adjacent at least one side of the base by implanting appropriate dopants into one of the recessed regions. A second sidewall oxide spacer is then formed on the vertical base emitter structure and a heavily doped collector contact region is formed by implanting appropriate dopants into another one of the recessed silicon regions. The collector contact region is self aligned to the second sidewall oxide spacer which prevents the contact of base and heavily doped collector. Finally, the oxide cap covering the upper emitter surfaces is removed and emitter, base and collector contact regions are silicided to reduce contact resistance.

8 Claims, 10 Drawing Sheets

METHOD OF FORMING A RECESSED CONTACT BIPOLAR TRANSISTOR AND FIELD EFFECT DEVICE

This is a continuation of application Ser. No. 411,208, filed Sept. 21, 1989, now U.S. Pat. No. 4,985,744 which is a continuation-in-part of our application Ser. No. 149,785, filed 1-29-88, now U.S. Pat. No. 4,897,703.

RELATED APPLICATIONS

"A BiCMOS Process for Forming Self-Aligned NPN Emitters and Bases and MOSFET/Source Drains", by Robert H. Havemann, Ser. No. 057,871, filed June 2, 1987 and "Bipolar Transistor Fabrication Using CMOS Techniques", by David Spratt and Rajiv Shah, Ser. No. 008,906, filed Jan. 30, 1987.

TECHNICAL FIELD OF THE INVENTION

The present invention relates in general to bipolar/CMOS semiconductor processing, and more specifically to the process of forming a scaled bipolar transistor structure that is compatible with the formation of CMOS structures on a single semiconductor substrate.

BACKGROUND OF THE INVENTION

The challenges associated with device scaling or reducing the size of device geometries have become a focus of attention for both bipolar and MOS VLSI technologies in recent years. In addition, the integration of FET structures and bipolar transistors on a single substrate has become very desirable. Each of these technologies provides inherent advantages. Bipolar transistors provide high transconductance and, as a result, are very suitable for high speed VLSI devices. On the other hand, CMOS technology offers the advantages of low power operation and very high packing density. It has become clear that the exploitation of the high current driving capabilities of the bipolar transistor is important and that bipolar device scaling is critical to obtaining even higher levels of bipolar or merged bipolar CMOS integration.

Previous efforts to scale the geometries of the bipolar transistor have been directed to reducing the lateral dimensions of the device by photolithographically scaling the feature sizes. Using this approach, the desired breakdown voltages are typically accomplished by maintaining critical lateral spacings through appropriate adjustments in photomask pattern dimensions. By incorporating processes that include the use of polysilicon and self-alignment techniques, even further advances in performance and packing density have been realized. These improvements are largely the result of minimizing excessive parasitic extrinsic regions of the bipolar device. One recent technique to reduce the collector-base area is to self-align the emitter to the base by making direct contact to the emitter with a polysilicon layer. Polysilicon has also been used to contact the base of the transistor which has the effect of reducing the collector to base area. See, for example, Cuthbertson et al, Self-Aligned Transistors with Polysilicon Emitters for Bipolar VLSI, IEEE Trans. Electron Devices, vol. ED-32, No. 2, pp. 242-247., February 1985.

Such techniques have more recently been implemented in a bipolar-based BiCMOS process which uses the second level polysilicon layer of the CMOS process to form the bipolar polysilicon emitter. This allows a small sized, shallow emitter structure without additional processing steps (see Ikeda et al, High-Speed BiCMOS Technology with a Buried Twin Well Structure, IEEE Trans. Electron Devices, vol. ED-34, No. 6, pp. 1304-1309, June 1987).

While the above described methods have allowed ever increasing improvement in device performance and packing density, there exists a need for even further reduction in feature size that is not limited by photolithography for controlling critical dimensions between diffusions. In addition, there exists a need for improving device performance by eliminating parasitic peripheral diode effects and the level of stored charge in the collector region. Finally, it would be desirable to provide a method of producing a scaled bipolar device having the above improvements with a simplified manufacturing process that is compatible with various bulk and silicon-on-insulator isolation schemes as well as CMOS process technology.

It is therefore an object of the invention to provide a method of making a bipolar transistor that reduces the area of the transistor structure and improves the packing density of integrated circuits incorporating said transistor. It is also an object of the invention to provide a bipolar transistor having a reduced extrinsic base area with a corresponding reduction in the parasitic capacitance to improve device switching performance. It is yet another object of the present invention to provide a simplified bipolar transistor process which eliminates the need for a highly doped buried collector layer. It is still another object of the invention to provide a bipolar transistor process which improves voltage breakdown control by device scaling which is independent of photolithographic operations. An additional object of the invention is to provide a bipolar transistor that reduces the effect of parasitic emitter to base diode characteristics. Finally, it is a further object of the present invention to provide a bipolar transistor process that is (automated) layout compatible with CMOS manufacturing processes.

SUMMARY OF THE INVENTION

In accordance with the present invention there is provided a method of manufacturing a bipolar semiconductor device having reduced dimensions and improved operating characteristics while being process compatible with MOS device structures. An intrinsic base region is formed in a epitaxial layer overlying an insulator and a polysilicon layer is thereafter deposited, patterned and etched to form emitter regions. An insulating layer is formed on the upper surfaces and side walls of the polysilicon emitters to provide a first sidewall spacer. The single crystal silicon is then selectively etched through a major portion of the intrinsic base and self-aligned to the sidewall insulator covering the emitter regions. A heavily doped base contact region is then formed adjacent at least one side of the base-emitter pedestal previously formed and a second sidewall insulating spacer is formed over the base-emitter structure. The collector contact region is formed adjacent a second side of the base-emitter structure by implanting the appropriate dopant while using the second sidewall spacer as a portion of the implant mask to offset the heavily doped collector contact region from the intrinsic base. Finally, the insulating layer on the surface of the polysilicon emitter regions is patterned and etched and emitter, base contact, and collector contact regions are silicided. The device may then be processed using standard methods to provide appropriate interconnect metallization and passivation.

A technical advantage is provided in that by separating the base and collector contacts from the emitter in the vertical direction, parasitic diode action between the base and collector contacts is reduced or eliminated. A further technical advantage is the improved device switching speed resulting from the close proximity of the collector contact to the emitter which allows for a reduction in the area of the lightly doped collector and a corresponding reduction in the amount of stored charge in this region. In addition, improved device switching performance is attained by a reduction in the extrinsic base area and a resulting reduction in associated parasitic capacitances. A further technical advantage is the close spacing of collector contact and emitter regions which allows for the elimination of the heavily doped buried layer and buried layer contact which simplifies the manufacturing process. Yet another technical advantage of the present invention is the reduction in area required for the scaled bipolar transistor which greatly improves packing density allowing higher levels of device integration. Finally, an additional technical advantage is the improved breakdown voltage control resulting from a device scaling method which is independent of photolithographic limitations. Additionally, the process disclosed herein is compatible with CMOS device processing and numerous bulk and silicon isolation schemes making it ideally suitable for BiCMOS VLSI applications.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
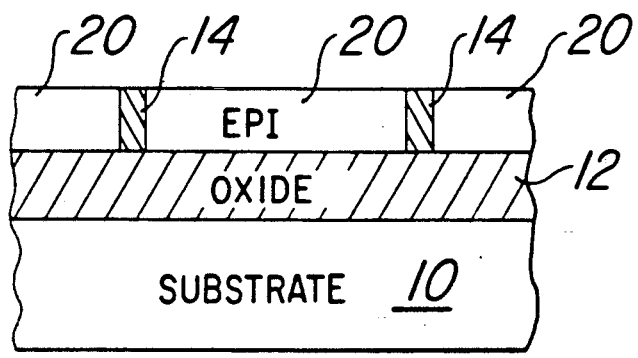
FIG. 1 illustrates the initial structure of a preferred embodiment of the transistor which includes an epitaxial layer overlying an oxide insulator and trenches through the epitaxial layer which are filled with insulating material for device isolation.

Referring to FIG. 1, there is shown a cross-sectional view of a silicon on insulator structure that includes a semiconductor layer 10 having an overlying oxide layer 12 and an epitaxial silicon layer 20 overlying layer 12. Totally isolated epitaxial silicon islands may be formed by etching isolation trenches 26 through layers 20 and subsequently refilling these trenches by depositing an oxide or suitable insulating material 14. This method results in closely spaced epitaxial substrate regions 20 that form the active device areas. A similar structure may be fabricated by using the method disclosed in U.S. patent application Ser. No. 810,001, filed Dec. 17, 1985 and entitled "Semiconductor Isolation Using Trenches and Oxidation of Anodized Silicon Sublayer". An additional description of an isolated silicon structure which would be suitable for use in the present method may be found in U.S. patent application Ser. No. 806,258, filed Dec. 6, 1985 and entitled "High Definition Anodized Sublayer Boundary". The two patent applications cited above are herein incorporated by reference. It should also be noted that the bipolar transistor structure of the present invention may be formed in a silicon substrate that is not totally surrounded by insulating material.

That is to say that the method need not start with a silicon on insulator active area but may begin by forming these active areas by using traditional bulk silicon isolation techniques. Such techniques may include recessed or non-recessed LOCOS isolation or various deep trench isolation methods.

Figure 2:
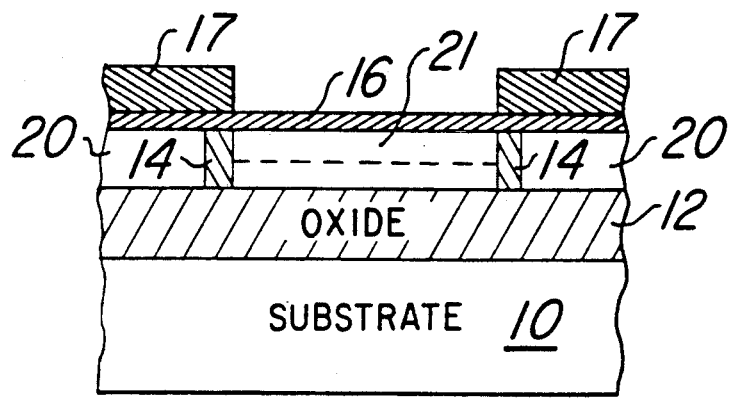
FIG. 2 illustrates a cross-sectional view of the isolated structure after the formation of the intrinsic base region in an upper portion of the epitaxial layer with a protective oxide layer in place.

Referring now to FIG. 2, the process continues by growing protective oxide layer 16 on the surface of the structure as shown in FIG. 1. This oxide may be grown to a thickness of, for instance, 120 Angstroms. Following this oxidation step, a base blocking photoresist layer 17 is deposited and patterned to define intrinsic base regions in the desired epitaxial silicon layers. Photoresist 17 is etched and Boron is implanted in the upper portion of epitaxial layer 20 to a dosage of approximately 1.5E14 at an implant energy of 60 KEV to form intrinsic base layer 21. Portions of base layer 21 will become the base region of bipolar NPN transistors to be described in detail hereinbelow.

Figure 3:
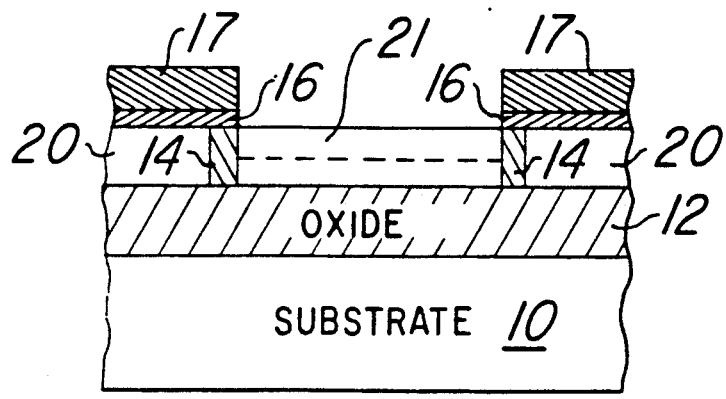
FIG. 3 illustrates the structure after removal of the protective oxide from the active device region.
Figure 4:
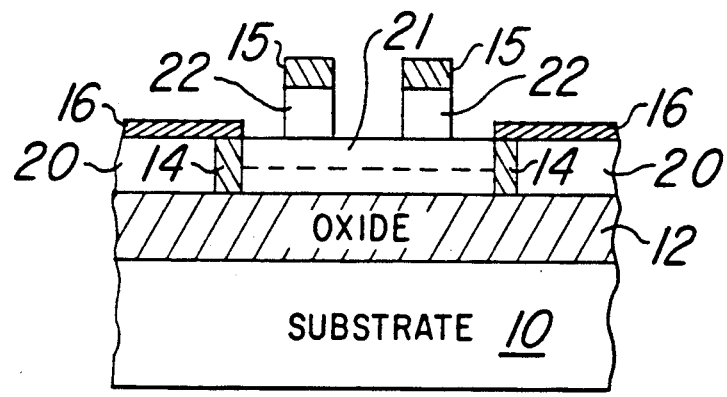
FIG. 4 illustrates a cross-sectional view of isolated base structure after the formation of oxide capped polysilicon emitter regions thereon.
Figure 5:
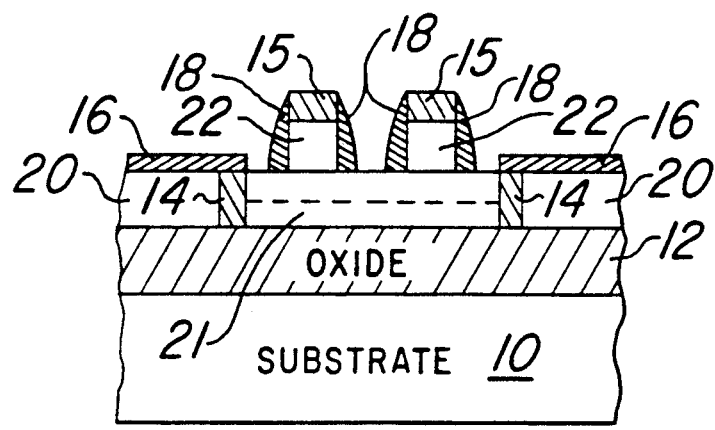
FIG. 5 illustrates a cross-sectional view after the formation of a first sidewall insulator spacer on the sides of the capped emitter structure.

With patterned photoresist layer 17 remaining in place, the portions of protective oxide layer 16 that cover base layer 21 are etched as is shown in FIG. 3. The photoresist layer 17 is then stripped. Referring next to FIG. 5, a layer of undoped polysilicon is deposited by using a low pressure chemical vapor deposition (LPCVD) technique. This polysilicon layer is then doped by implanting phosphorus to a dosage of approximately 2.0E16 at an implant energy of 100 KEV. Thereafter an insulating layer of oxide is deposited to a thickness of approximately 2000 Angstroms. The oxide deposition utilizes a process referred to as Tetraethoxysilane (TEOS) deposition which forms an insulator that etches at a faster rate than thermally grown oxide. Next, a layer of photoresist (not shown) is deposited and patterned to define the self-aligned polysilicon emitter structure. The TEOS layer is then selectively etched and following that operation, the polysilicon layer is etched away in those areas not covered by the remaining TEOS pattern. As shown in FIG. 4, the resulting structure includes at least one polysilicon emitter 22 formed on extrinsic base layer 21 an capped with insulating TEOS layer 15.

The process continues by depositing a insulating TEOS layer approximately 2000 Angstroms in thickness. This layer is then patterned and anisotropically etched to leave only the sidewall oxide spacer 18 on the sides of the capped polysilicon emitter structure (layers 22 and 15) as shown in FIG. 5. The sidewall oxide spacer 18 serves to "nest" the polysilicon emitter 22 by totally surrounding it with insulating material and also provides a masking material for subsequent etching steps and implantation operations.

Figure 6:
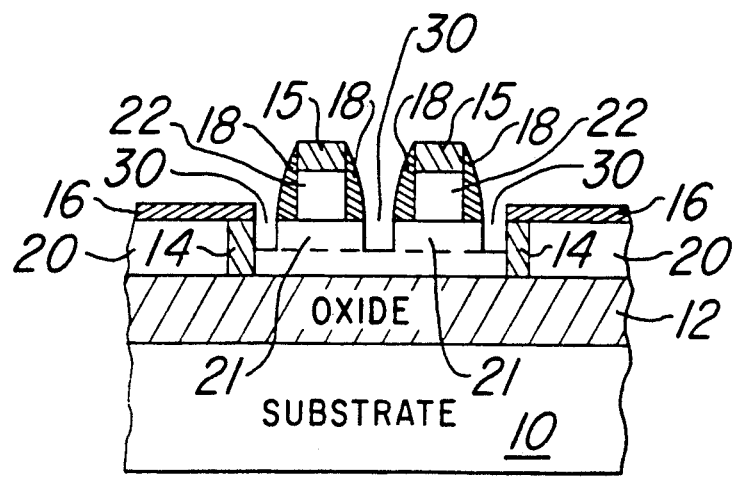
FIG. 6 illustrates a cross-sectional view of the active device structure after the process of selectively etching portions of the base layer to form stacked emitter-base structures in the active device regions.

As shown in FIG. 6, the structure is next patterned and the epitaxial silicon intrinsic base layer 21 is etched to a depth of approximately 3500 Angstroms to form contact recesses 30. The recesses etched in the silicon during this step of the process should penetrate at least a major portion of base layer 21 and will form the base and collector contact recessed regions. The resulting structure includes isolated stacked structures which have an N type polysilicon emitter 22 overlying a P type base layer 21 on an N type epitaxial silicon layer 20.

Figure 7:
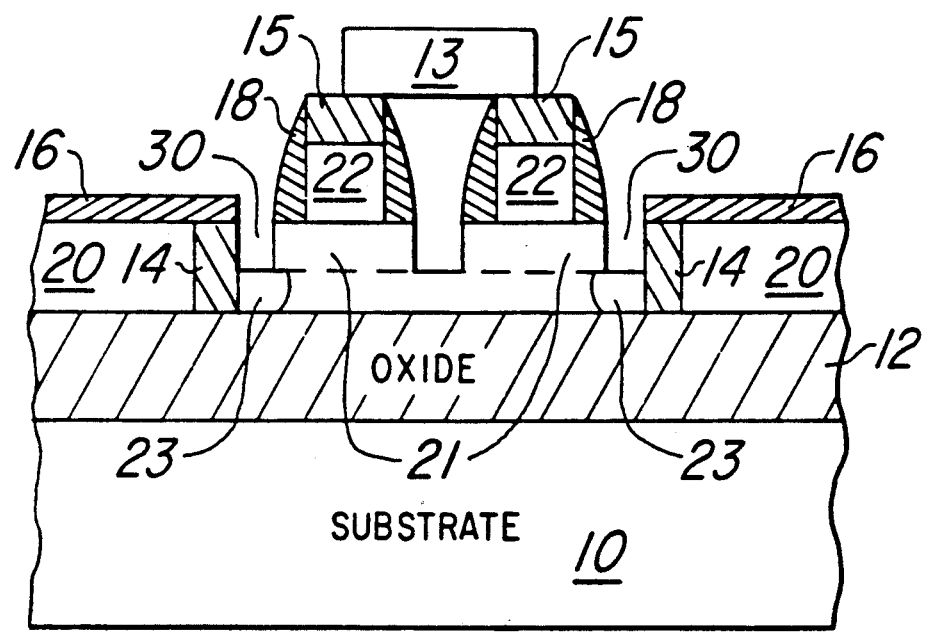
FIG. 7 illustrates a cross-sectional view of the device after the implantation of the self-aligned extrinsic base.

Referring now to FIG. 7, a base contact blocking resist layer 13 is formed over the structure and patterned to define base contact regions 23 in the contact recesses 30 on one side of the base-emitter stacked structure. Boron is then ion implanted at a dosage level of approximately 5.0E15 and an implant energy of 50 KEV to form the base contact regions 23 in epitaxial silicon layer 20. Note that the sidewall oxide spacer 18 on the base-emitter structure forms an appropriate implant mask during this operation and the heavily boron doped region 23 makes contact to base layer 21.

Figure 8:
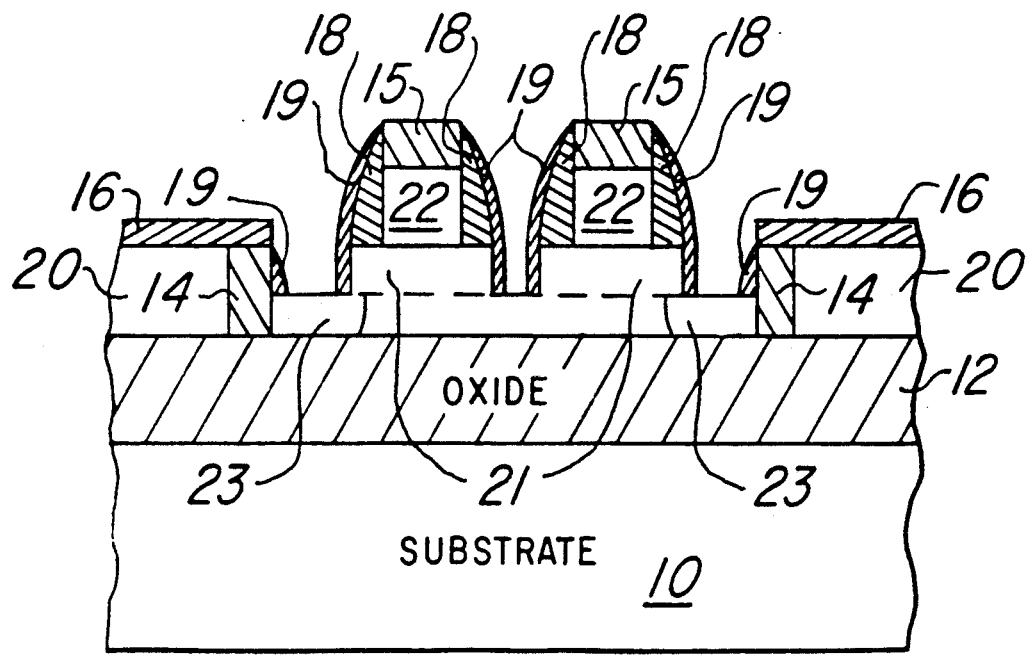
FIG. 8 illustrates a cross-sectional view of the transistor structure after the formation of a second sidewall insulator spacer on the sides of the stacked emitter-base structure.

The process continues by depositing an insulating TEOS layer having a thickness of approximately 3500 Angstroms. This layer is then patterned an anisotropically etched to form a second sidewall oxide spacer 19 which covers the sides of base layer 21, sidewall oxide spacer 18 and the sides of the oxide isolation material 14 while exposing reduced area contact regions in the base-collector contact recesses 30 as shown in FIG. 8.

Figure 9:
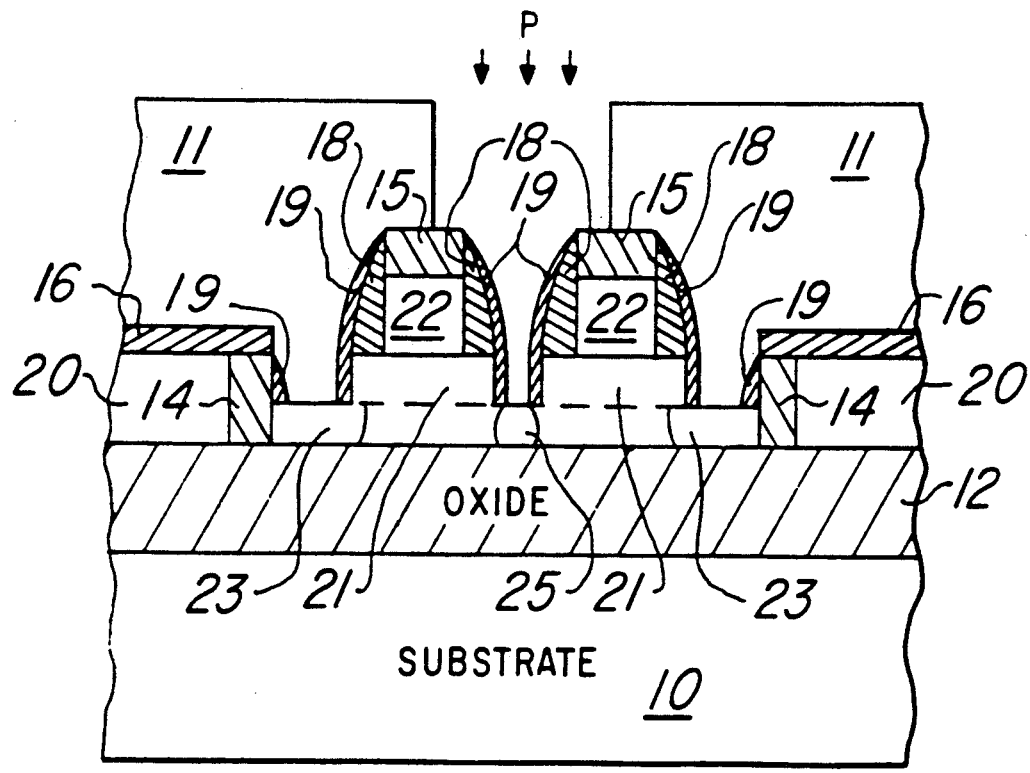
FIG. 9 illustrates a cross-sectional view of the device after collector contact patterning and ion implantation.

A layer of collector contact blocking resist 11 is next deposited and patterned to define the collector contact region 25. After etching layer 11, phosphorus is ion implanted at a dosage of approximately 2.0E16 and an implant energy of 100 KEV to form a heavily doped collector contact region 25 as shown in FIG. 9. Note that the sidewall oxide spacer 19 serves as a mask during this operation to ensure that contact region 25 is appropriately spaced from base layer 21. The structure may now be subjected to a high temperature emitter anneal process of, for example, 900 degrees centigrade for 10 to 15 minutes. From an examination of the transistor structure at this stage of the process, it can be appreciated that by the use of the silicon etch and the two sidewall oxide spacers, the active emitter is separated from the heavily doped base and collector contacts in the vertical direction allowing a reduction in overall transistor area. In addition, this is accomplished without the limitations of photolithographically defining a lateral spacing between diffusions. Moreover, the ability to space the heavily doped collector contact in close proximity to the base layer 21 provides a transistor with a low Rcs value thereby eliminating the need to incorporate a low resistance, deep collector region.

Figure 10:
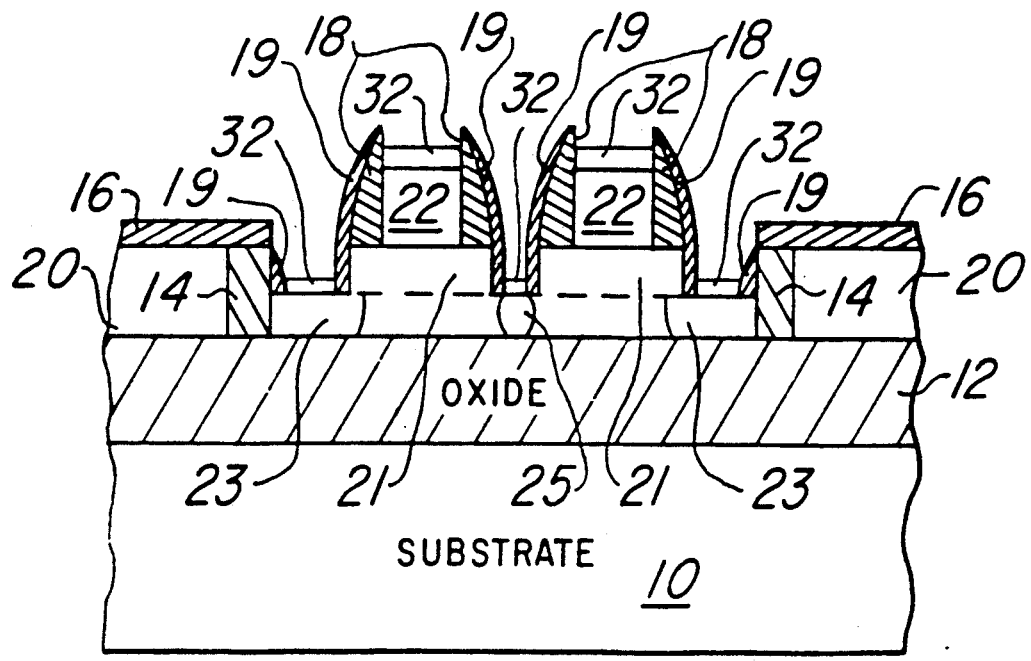
FIG. 10 illustrates a cross-sectional view of the device structure after the removal of the emitter oxide cap and the formation of a metal silicide on the base, emitter and collector silicon surfaces.

Referring next to FIG. 10, the process continues by depositing and patterning a cap oxide resist (not shown) and thereafter etching the polysilicon emitter cap oxide 15 to expose the upper surface of the phosphorus doped emitter 22. A layer of metal such as platinum having a thickness of approximately 450 Angstroms is next deposited and thereafter sintered to form metal silicide layers 32 on polysilicon emitter 22, base contact regions 23, and collector contact region 25. The portions of the platinum that do not react to form titanium disilicide are stripped using an appropriate etchant. The siliciding process is described in U.S. Pat. No. 4,545,116, which is incorporated herein by reference and will not be further described here.

Figure 11:
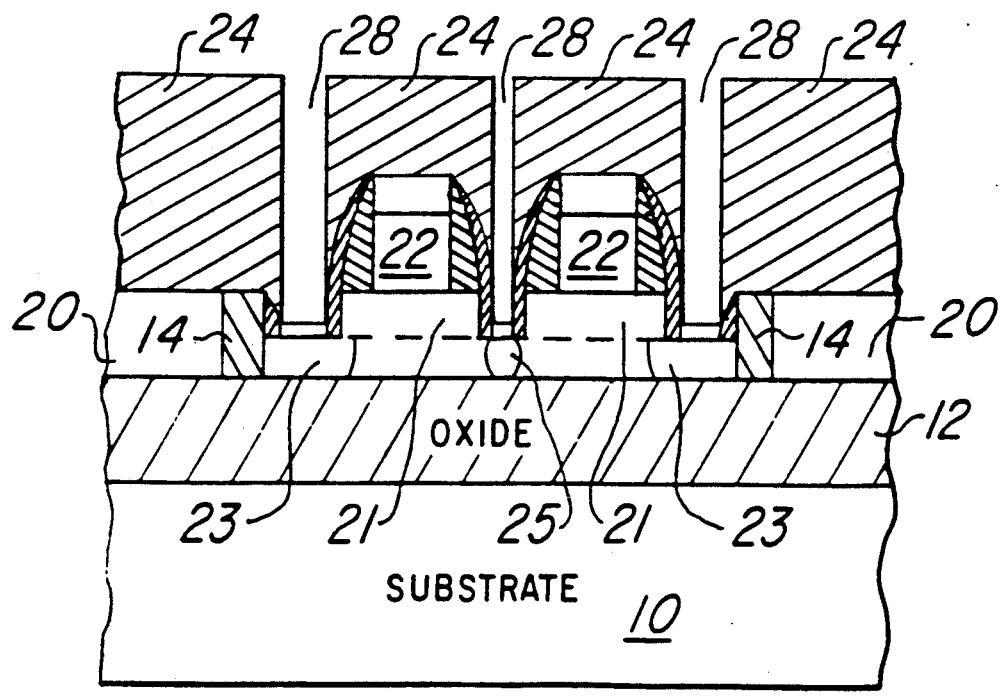
FIG. 11 illustrates a cross-sectional view of the transistor structure after deposition, patterning and etching an interconnect insulating layer.
Figure 12:
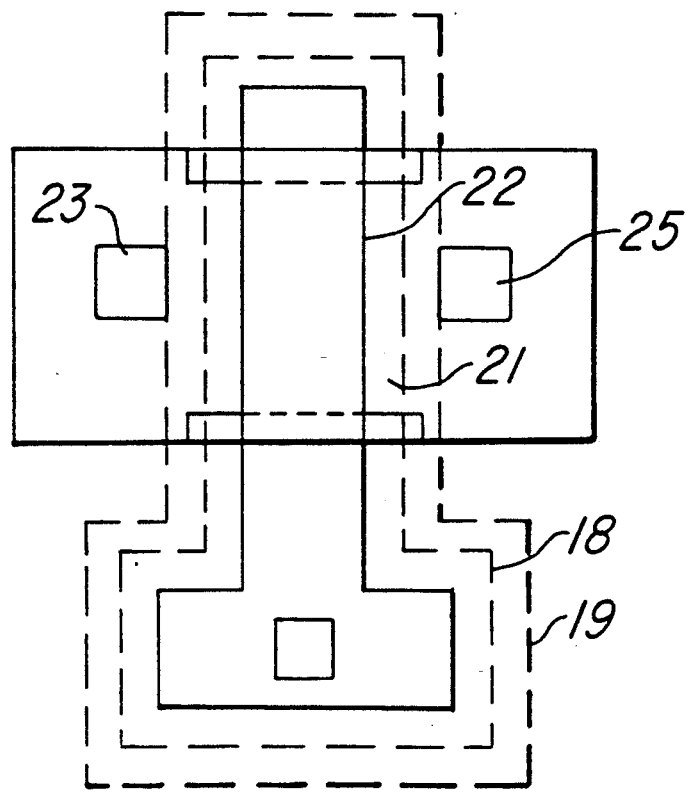
FIG. 12 illustrates a top view of the transistor structure.

As shown in FIG. 11, an oxide insulating layer 24 is next deposited on the surface of the structure and thereafter planarized to provide acceptable contours for subsequent interconnect metallization. Oxide layer 24 is then patterned and etched to form suitable contact vias 28 in the desired emitter, base and collector contact regions. A first level metal pattern of, for instance, an aluminum-titanium tungsten alloy may then be formed to make contact to the desired silicided surfaces through vias 28 and patterned/etched to form an appropriate interconnect. Additional levels of interconnect may be desirable as dictated by the complexity of the circuit design.

In summary, there has been provided a method for fabricating a scaled, self-aligned bipolar transistor. The method includes a first step of forming a shallow intrinsic base region in an isolated epitaxial silicon layer and thereafter forming oxide capped polysilicon emitters which are nested by forming a first oxide insulator on the sidewall of the emitter structure. A silicon etch is used to form recessed contact regions for base and collector contacts and the base contact is formed by a self-aligned ion implantation of a suitable dopant using the first sidewall oxide as a part of the implantation mask. A second sidewall oxide spacer is formed on the sides of the on the emitter-base stacked structure and the collector contact is formed by ion implanting into an appropriate recessed contact region a suitable dopant using the second sidewall spacer as a portion of the implantation mask. The collector contact so formed is spaced from the base by the second sidewall spacer and because this dimension may be made very small, the need for a heavily doped buried collector region is eliminated. The bipolar transistor proposed herein may be incorporated into a standard double polysilicon CMOS process flow having fewer additional photomasking steps than conventional BiCMOS processes. In addition, the bipolar transistor disclosed herein is fully compatible with silicon on insulator (SOI) technology. The presence of a buried oxide completely confines the heavily doped P-type depletion region at the silicon oxide interface which significantly reduces the extrinsic base capacitance.

Figure 13:
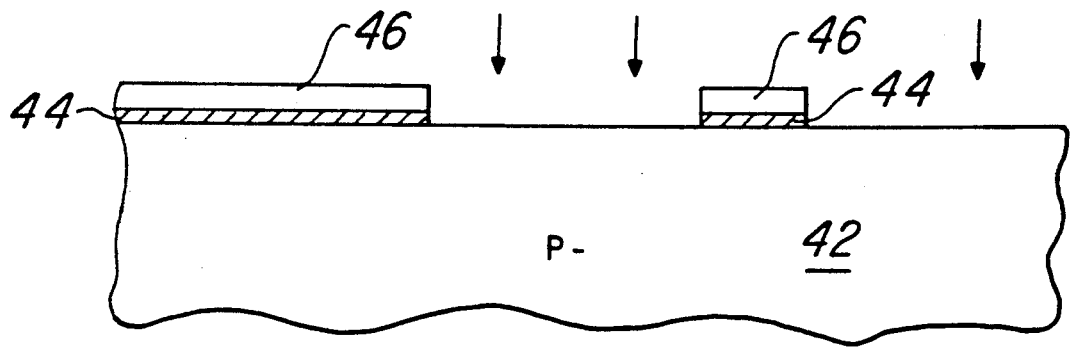
FIG. 13 illustrates the initial structure of a BiCMOS embodiment showing a cross-sectional view of the buried layer pattern and ion-implant.

A preferred method of integrating the bipolar transistor of the present invention in a bipolar-CMOS process begins as shown in FIG. 13. A masking layer, including silicon dioxide layer 44 underlying silicon nitride layer 46, is formed over lightly doped single crystal silicon substrate 42. Layers 44 and 46 may be formed by well known methods such as first growing oxide layer 44 to a thickness of approximately 50 nm and thereafter depositing silicon nitride layer 46 using low pressure chemical vapor deposition techniques to a thickness of approximately 100 nm. As shown, the oxide and nitride layers are patterned to provide an appropriate mask for the heavy dose n+ ion implantation. A suitable n+ buried region may be formed by implanting antimony at an energy of approximately 40 keV at a dose of about 5E15 ions/cm2. Other dopants, for example arsenic, may be selected for the above buried layer ion implantation step.

An alternate technique may include the formation of a thick oxide layer (e.g. 4500 Angstroms) which is patterned prior to the implantation of antimony under the above conditions.

Figure 14:
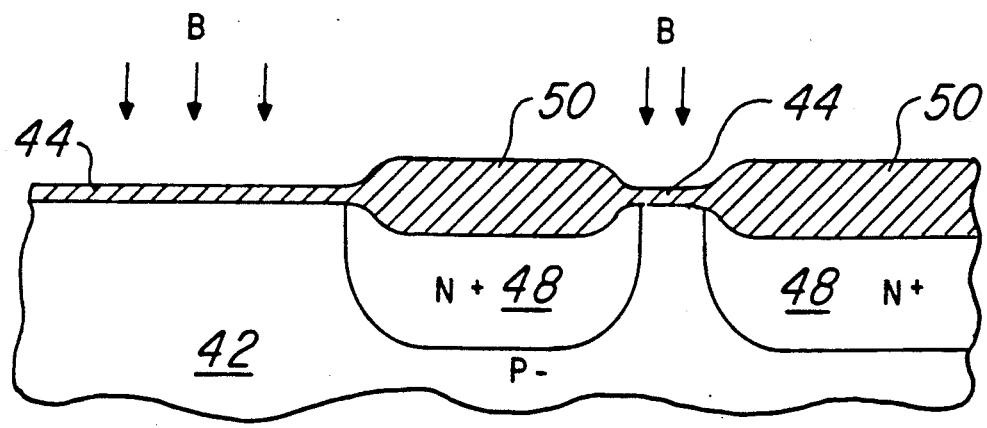
FIG. 14 illustrates a cross-sectional view of the buried p region pattern and implant.

As shown in FIG. 14, the implanted antimony is next diffused into substrate 42 to form the buried n+ regions 48. This is accomplished by annealing the structure at high temperature. In the present embodiment, an anneal at 1250 degrees C. for 30 minutes is sufficient to drive buried region 48 to a depth of 2-3 microns. During the high temperature anneal operation a thermal oxide 50 is grown in those regions not protected by the nitride masking layer.

Referring still to FIG. 14, a boron implant is next performed to form buried p regions in substrate 42. This operation may be carried out an energy of approximately 40 to 150 keV and a dose of about 5E12 to 2E13 ions/cm2. Thick oxide regions 50 serve to mask the implant. A high temperature anneal may be performed to activate and drive the implanted boron which forms the p regions 52 and 52' of FIG. 15. An alternative method may eliminate the p type buried layer by providing a substrate 42 that is doped to a level that is sufficient to prevent punch through between adjacent n+ regions 48. It should be clear from the above description that by using thick oxide 50 as an implant mask, n type and p type buried layers are self-aligned. In addition, the above method results in one less masking operation at this point in the process. Should it be desirable to space the p buried region from the n buried region, two separate photo masking operations could be implemented.

Figure 15:
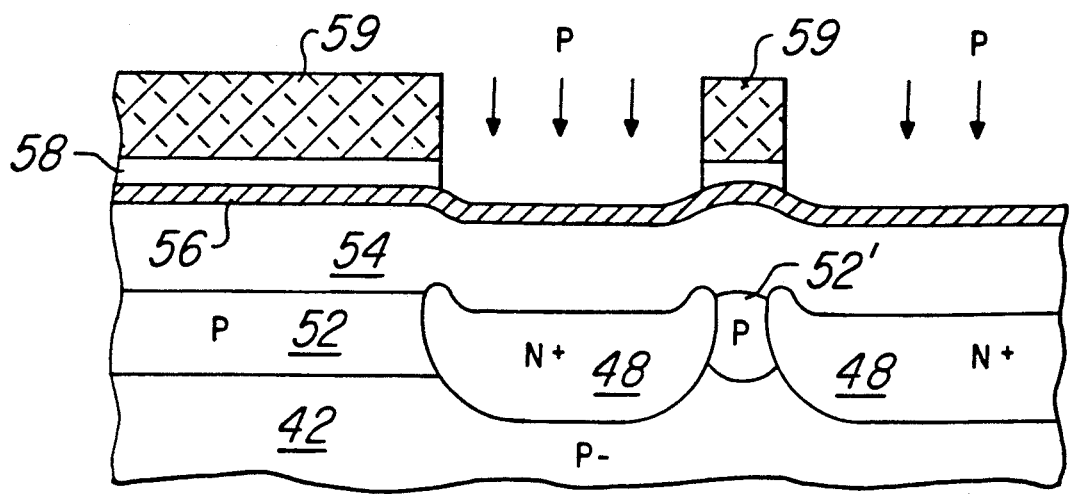
FIG. 15 illustrates the formation of epitaxial layer and n-well ion implant.

The process continues by removing oxide layers 44 and 50 and growing a lightly doped n type epitaxial layer 54 as illustrated in FIG. 15. This layer may be grown to a thickness of about 0.75 to 1.50 using well known techniques and will form the semiconductor layer in which both bipolar and MOS device structures are fabricated.

Referring still to FIG. 15, a thin layer of oxide 56 is grown on the surface of epitaxial layer 54 and a layer of silicon nitride 58 having a thickness of about 100 nm is thereafter deposited. Nitride layer 56 is then patterned using photoresist layer 59 as a mask to form a nitride mask for the n-well implant. The ion implantation of n-well regions in epitaxial layer 54 may be performed under a variety of conditions. In the present process the desired dopant profile is accomplished by a dual implant of phosphorus. Typical implant conditions may include a light implant having a dose of 1E12 ions/cm2 at 70 keV followed by a heavier implant having a dose of about 1.2E12 ions/cm2 at 350 keV. These implants may be performed with the regions of thin oxide layer 56 not covered by nitride left in place as shown.

Figure 16:
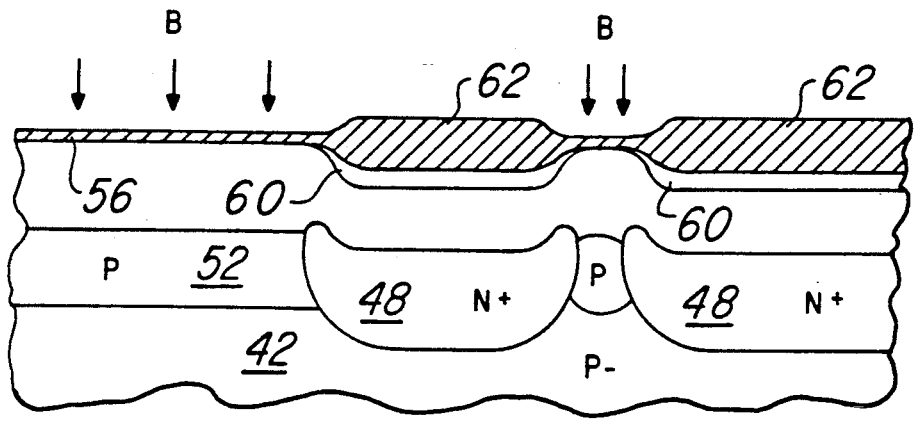
FIG. 16 illustrates a cross-sectional view showing the P-well implant.

Referring now to FIG. 16, oxide regions 62 having a thickness of about 350 nm are grown over n-well regions 60 by subjecting the structure to a steam atmosphere of 900 degrees C. for about 30 minutes. Following this step, nitride layer 58 is removed and a p-well boron implant is performed using oxide layer 62 as an implant mask. Appropriate implant conditions include a dose of 1E12 ions/cm2 at 50 keV. Both n-wells and p-wells are driven to the desired depth of 1 micron by next performing a high temperature anneal at about 1000 degrees C. for 150 minutes.

Figure 17:
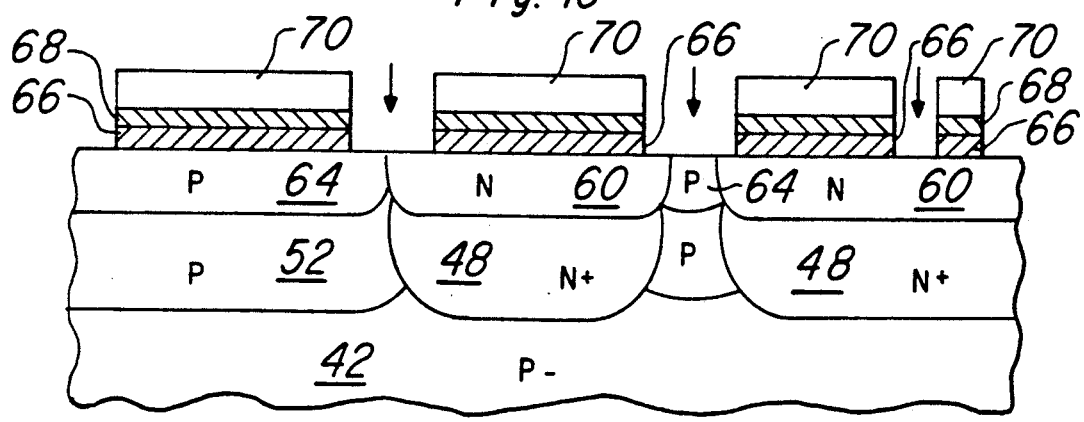
FIG. 17 illustrates a cross-sectional view of the structure patterned for LOCOS oxidation.

Thick field oxide isolation regions may now be provided between p-well regions 64 and n-well regions 60. After removing the oxide layers 62 and 56 shown in FIG. 16, a layer of oxide 66 having a thickness of approximately 10 nm is grown as shown in FIG. 17. A thin 50 nm polysilicon buffer layer 58 is next deposited followed by a layer of silicon nitride 70. The benefits of polysilicon buffer layer 58 in the formation of LOCOS isolation are described in detail in U.S. Pat. No. 4,541,167 issued Sept. 17, 1985 and assigned to Texas Instruments Incorporated. The three layers are patterned and a boron channel stop implant is next performed at a dose of 3E12 to 5E12 ions/cm2 at an energy of about 40 keV. High pressure oxidation in steam at, for example, 900 degress C. for about 52 minutes provides the thick field regions 72 shown in FIG. 18. The resulting thickness of these regions should be on the order of 700 nm.

Figure 18:
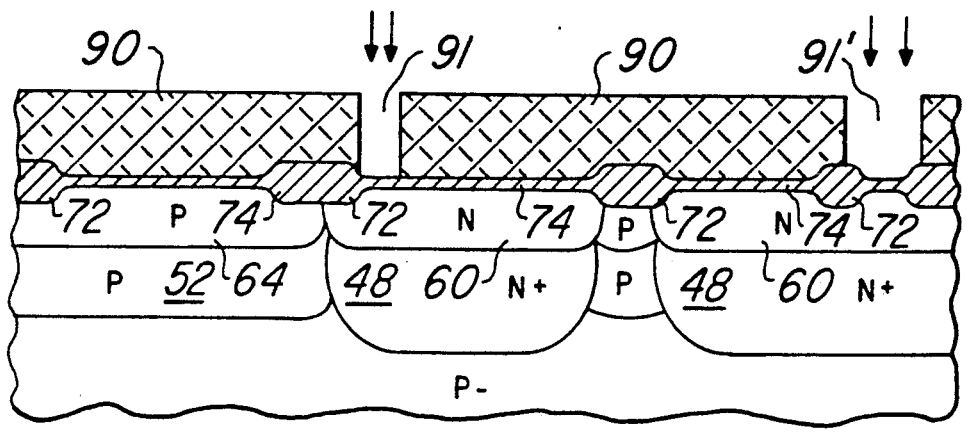
FIG. 18 illustrates a cross-sectional view of the structure during the deep N+ contact implant.
Figure 19:
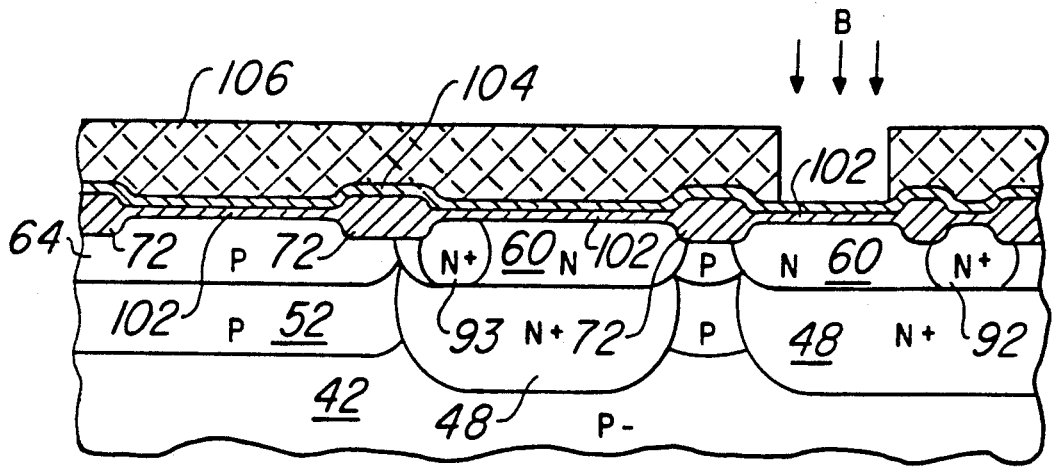
FIG. 19 illustrates a cross-sectional view of the device during bipolar base ion implantation.

The process continues by removing the oxide layer 66, polysilicon layer 68 and silicon nitride layer 70. A thin pregate oxide 74 is then grown to a thickness of about 20 nm as shown in FIG. 18. This oxide serves to protect the epitaxial surface prior to the formation of final gate oxide. Photoresist layer 90 is then formed and patterned to expose portions of the n-well regions 60 overlying the buried regions 48. As is well known in the art, buried n+ regions are particularly suited for use as the collector electrodes of bipolar transistors. Moreover, direct contact to a buried n+ region underlying n-wells containing MOS transistors is known to improve latchup sensitivity. Accordingly, the structure is next implanted with phosphorus at a dose of about 5E15 to 2E16 ions/cm2 and energy of 150 keV to form a deep bipolar collector contact in portion 91' of region 60 wherein a bipolar transistor will be formed. At the same time, a portion 91 of region 60 were MOS transistors will be fabricated is appropriately doped. The resulting n+ regions 92 and 93 respectively form the bipolar and MOS deep n+ contacts as illustrated in FIG. 19. It should be noted that the above described deep contacts could be formed using alternative processes such as direct contact to the buried n+ region by way of a heavily doped deposited polysilicon plug.

After removal of removal of resist layer 90 and pregate oxide 74, gate oxide layer 102 is grown to the desired thickness, for example approximately 20 nm. In the present preferred embodiment this oxidation is accomplished by a dry/steam/dry sequence at a temperature of 850 degrees C. It should be noted that any suitable gate dielectric process could be used for this operation including the formation of alternate dielectric materials or combinations of materials. As shown in FIG. 19, a layer of polysilicon 104 having a thickness of about 125 nm is next deposited using well known techniques such as LPCVD. At this state of the process it is desirable to perform a MOS transistor threshold voltage adjust ion implantation. This well known implant operation (not shown) uses the field oxide isolation regions 72 as a mask and typically incorporates a p type dopant implanted at low energy. If desired, this implant may be performed through the pregate oxide 74.

Referring still to FIG. 19, a layer of photoresist selectively removed to provide a pattern for the NPN base region. Boron is then ion implanted at a dose of approximately 8E13 ions/cm2 at an energy of about 80 keV to form p type base region 101. While the base region 101 as shown is implanted through both gate oxide 102 and buffer polysilicon layer 104, an alternative method would include selectively etching polysilicon layer 104 and implanting the base through only oxide layer 102. Following the base implant operation, portions of polysilicon layer 104 and gate oxide layer 102 overlying base region 101 are removed using well known etching methods.

Figure 20:
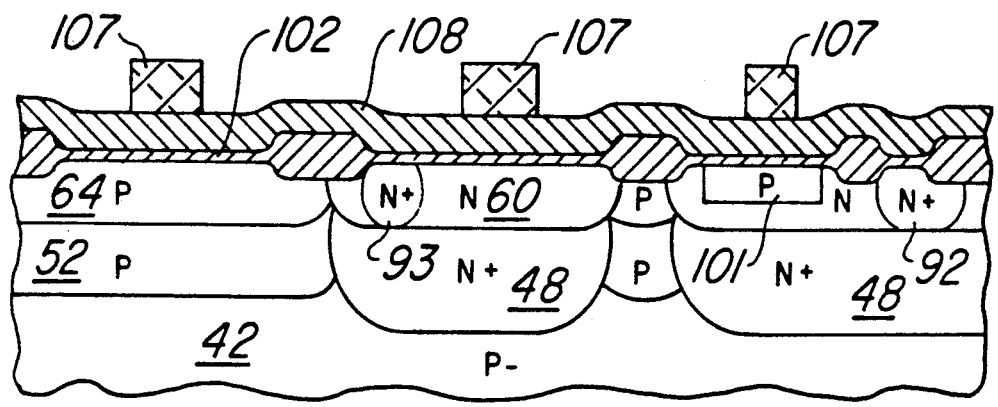
FIG. 20 illustrates a cross-sectional view after deposition of the polysilicon layer which forms field effect device gate electrodes and bipolar emitter region.

Turning next to FIG. 20, after the removal of resist layer 106 a layer of polysilicon 108 is deposited by LPCVD over the surface of the structure including contact to the exposed p type base region. This layer is deposited to a thickness of approximately 325 nm and will form the self aligned emitter structure as well as MOS gate electrodes and interconnect if desired. The polysilicon is then doped by way of phosphorus implant at a dose of about 5E15 to 2E16 ions/cm2 and an energy of 80 keV. A resist layer 107 is applied and patterned to define the bipolar emitter and CMOS gate electrodes. As an alternative, arsenic may be used for this implant.

Figure 21:
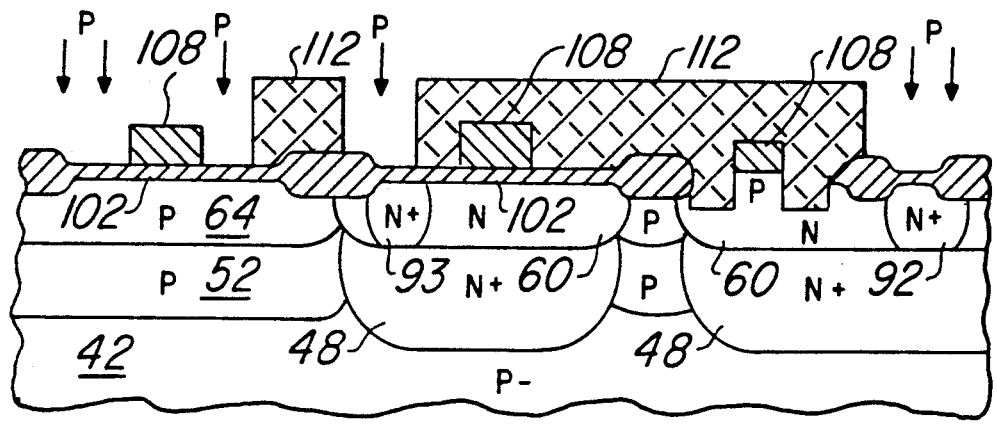
FIG. 21 illustrates a cross-sectional view of the structure after formation of the bipolar recessed contact structure and the patterned field effect transistor gate electrodes.

Referring to FIG. 21, the polysilicon layer 108 is next etched using well known techniques to define both n and p channel MOS gate electrodes and the emitter of the integrated NPN bipolar transistor. During the process of etching the polysilicon, portions of p type base region 101 on either side of emitter 108 are preferably etched to create recesses which will offset the emitter from the subsequently formed p+ extrinsic base contact regions. It is desirable to etch region 101 to a depth which penetrates a major portion of the implanted base. This offset is particularly desirable in that is serves to eliminate any parasitic region along the emitter sidewall which may cause the transistor current gain to vary with emitter size. A significant advantage of defining the emitter by the polysilicon gate pattern step is that both MOS gate electrodes and bipolar emitter are formed simultaneously and there is no need for a separate emitter contact pattern. Furthermore, since the bipolar transistor is self-aligned, the base resistance is not dependent on the alignment of polysilicon to an N emitter diffused contact which is common in some bipolar/BiCMOS processes. Finally, the bipolar device does not experience any additional emitter base-capacitance resulting from the polysilicon emitter electrode overlapping base oxide. As a result a high performance transistor is readily merged with the CMOS device structure.

The process continues as shown in FIG. 21 by the application and patterning of photoresist layer 112 which defines the source and drain regions for the n-channel MOS transistor and the n-well contact accomplished by ion implantation of phosphorus. Collector contact 92 and buried n+ region 93 may also be implanted at this time. A reach-through implant of phosphorus is then performed at a dose on the order of 2E13 ions/cm2 at an energy of about 80 keV. This implant is intended to form a shallow and lightly doped n-type "lightly doped drain" as described in U.S. Pat. No. 4,566,175 issued Jan. 28, 1987 and assigned to Texas Instruments Incorporated.

Prior to applying and patterning photoresist layer 112 as describe above, it may be desirable to form a thin layer of TEOS oxide (e.g. 30 nm) to minimize ion channeling into the source and drain regions and to offset the reachthrough implant from the polysilicon gate electrode 108. This will serve to compensate for lateral diffusion of the reachthrough implant and provide better alignment with the edges of electrode 108.

Figure 22:
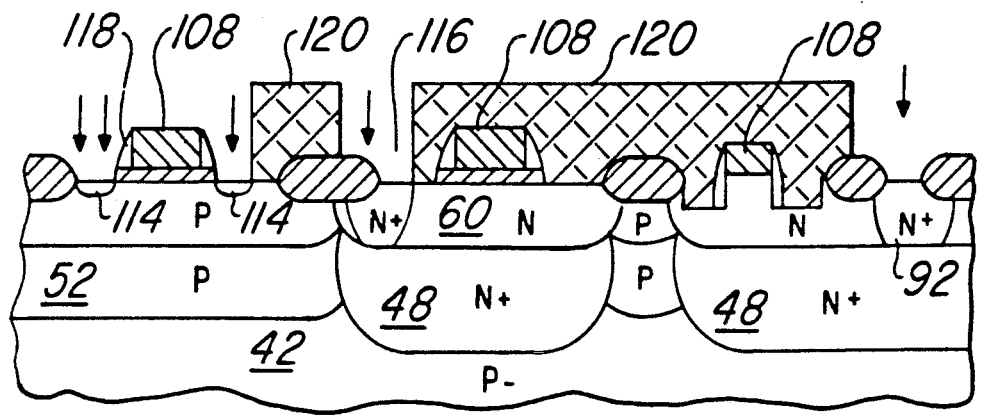
FIG. 22 illustrates a cross-sectional view of the structure showing the formation of sidewall insulators and N-channel source/drain and collector contact implants.

Turning now to FIG. 22, the previous resist layer 112 is removed and a layer of TEOS oxide having a thickness of approximately 200 nm is deposited. A sidewall insulator 118 is formed on the polysilicon electrodes by anisotropically etching the structure as described in the above referenced U.S. Pat. No. 4,566,175. Photoresist layer 120 is next applied and patterned to again expose n-channel MOS source and drain regions 114, n-well contact 116 and collector contact region 92. A high energy arsenic source/drain implant is next performed followed by a lower energy phosphorus implant. Suitable conditions for the above implants may include an arsenic dose of 3E15 ions/cm2 at about 150 keV followed by a phosphorus dose of 4E14 ions/cm2 at about 95 keV.

Photoresist layer 120 is stripped and a layer 122 of photoresist is formed and patterned to define the p-channel MOS source and drain regions 124, p+ contact 125 in p-well 64, and p+ base contact regions 126. The subsequent boron implant as shown by the arrows in FIG. 23 may be performed at a dose of 3E15 ions/cm2 at an energy of 20 keV. Note that the sidewall oxide spacer on the sides of emitter polysilicon 108 an p type base pedestal 101 serves to mask the implant and offset the p+ base contact region.

Figure 24:
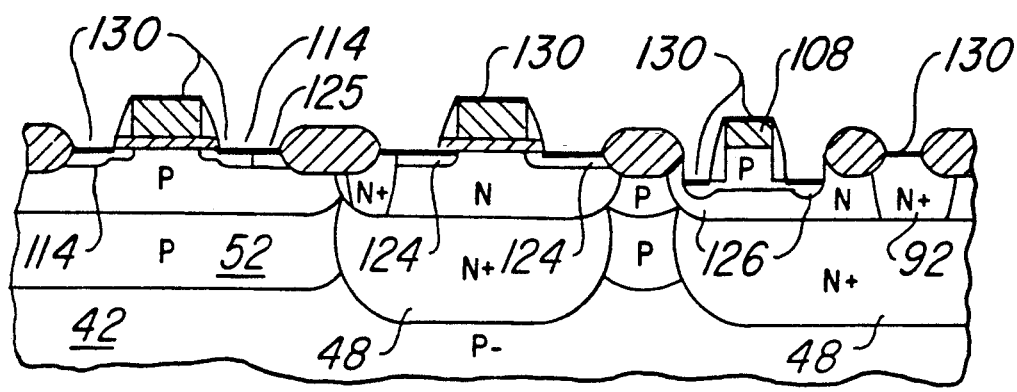
FIG. 24 illustrates the structure after the formation of metal silicide.

After the removal of photoresist layer 122, the implanted dopants are driven to the desired depth by a high temperature anneal which may be performed at, for example, 900 degrees C. for 25 minutes. The anneal serves to both drive the source/drain implant regions to an appropriate depth and also diffuses the n type dopant in the emitter polysilicon into the p-type base region. In addition, the base region 101 and base contact regions 126 are driven during this operation. The oxide remaining on MOS source/drain regions, base and collector contact regions and polysilicon pattern 108 is then cleared. If desired, the diffusions may be silicide clad by the deposition of a metal such as titanium for direct reaction with the exposed silicon as described in U.S. Pat. No. 4,690,730 issued Sept. 1, 1987, and assigned to Texas Instruments Incorporated. This process results in the formation of silicide layers 130 as shown in FIG. 24. A local conductive interconnect pattern (not shown) may now be formed by the patterning of the unreacted titanium on the silicide and oxide layers as described in U.S. Pat. No. 4,675,073, issued June 23, 1987 and assigned to Texas Instruments Incorporated. As an alternative, the silicided layer may be formed of platinum silicide as previously described above with reference to the prior NPN transistor embodiment.

In the above BiCMOS embodiment a separate deep n+ collector contact region 92 is provided and spaced from p+ base contact region 126 by a field oxide region 72. As described above, it may be desirable to fabricate a BiCMOS structure having the p+ extrinsic base 126 implanted adjacent only one side of the emitter and the n+ collector contact 92 implanted adjacent the other side of the emitter. In this case, it would then be possible to eliminate the n+ buried layer 48 if desired. For example, the above BiCMOS process flow could be modified by eliminating the formation of region 92 as shown in FIGS. 17 and 18 and thereafter forming a modified NPN transistor such that as shown in FIG. 10 of the bipolar transistor embodiment as discussed briefly below.

Figure 23:
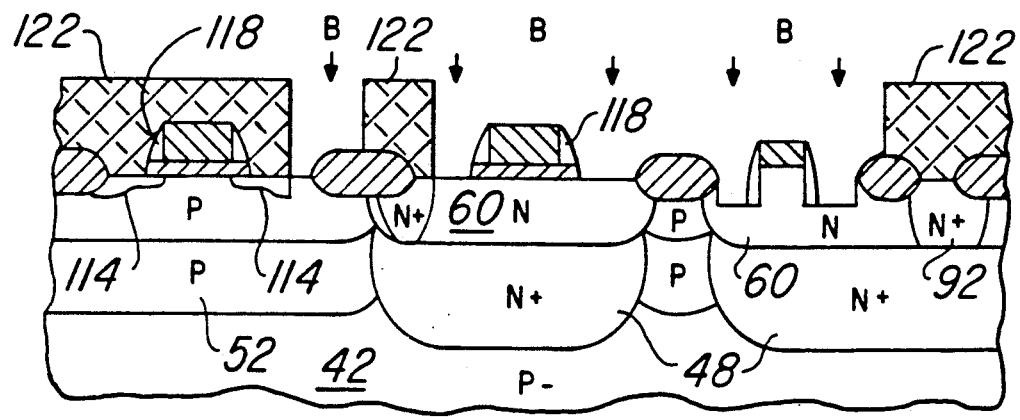
FIG. 23 illustrates a cross-sectional view during P-channel source/drain and extrinsic base ion implantation.
Figure 26:
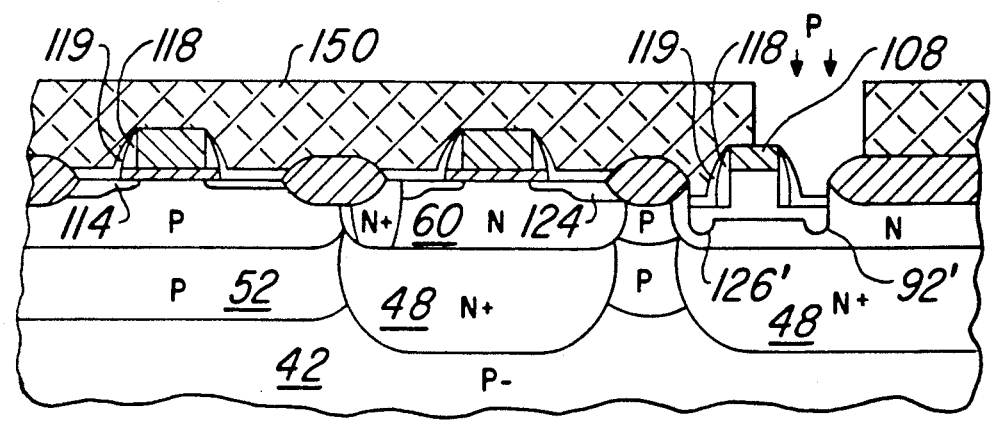
FIG. 26 reveals a cross-sectional view of an alternative method of forming the bipolar collector contact by using a double sidewall spacer technique.

While the double sidewall NPN transistor process has been previously described in detail with reference to FIGS. 1 through 10, the following additional description will help in understanding the implementation of this device beginning with the BiCMOS process flow at FIG. 22. As mentioned previously, n+ collector contact 92 would not be present at this point and the n+ source and drain regions 114 are formed as described above. Referring next to FIG. 23, the p+ source and drain regions 124 are next exposed and implanted. During this step in the process, photoresist layer 122 is patterned to expose only one side of bipolar emitter 108 which results in a single-sided p+ extrinsic base region 126'. Resist layer 122 is now removed and a selectively removable second sidewall layer such as polysilicon is deposited. For example, a layer of polysilicon 119 having a thickness of 2 to 3 thousand Angstroms may be formed and selectively etched to leave a second sidewall layer on the previously formed sidewall insulator 118. As shown in FIG. 26, a blocking resist layer 150 is applied and patterned to expose only the collector contact on one side of the bipolar structure. The n+ collector region 92' is then implanted and resist layer 150 and second sidewall polysilicon layer 119 are removed. At this point, the structure is ready for the formation of silicide as described above with reference to FIG. 24.

Figure 25:
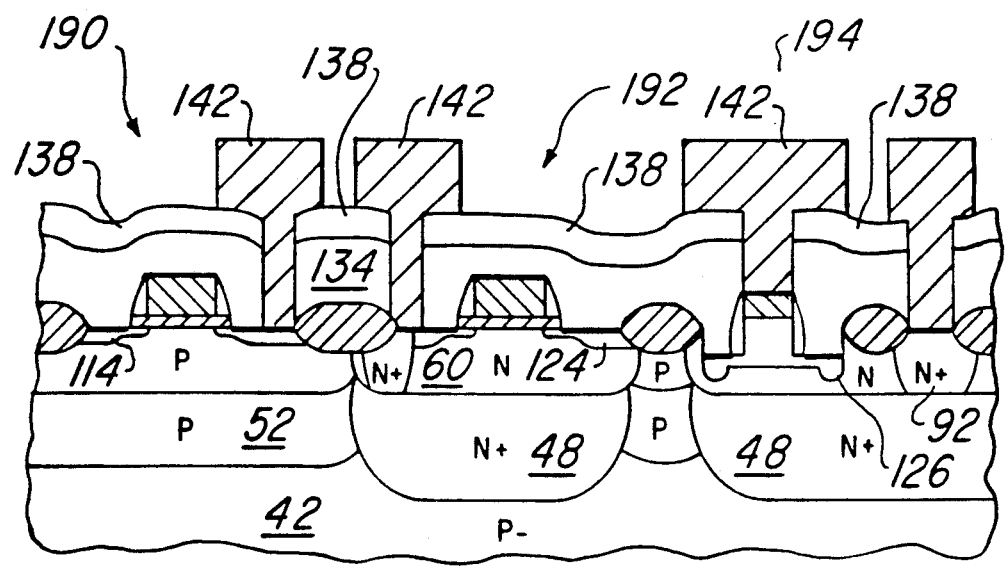
FIG. 25 reveals a cross-sectional view of the structure after first level metal contact formation.

Returning again to the process as shown after the step of siliciding source/drain and polysilicon regions, the process of interconnecting the BiCMOS structure will now briefly be described. Referring to FIG. 25, a multilevel dielectric 134 having a thickness on the order of one micron is LPCVD deposited and thereafter planarized. The structure is next coated with a secon thin TEOS oxide layer (about 100 nm thick) followed by a layer of phosphorus doped oxide 138 having a thickness of about 300 nm and a phosphorus concentration of about 5% by weight. Contact vias may then be patterned and etched and oxide 138 densified by a high temperature anneal at 700 degrees C. for approximately 60 minutes. A first level metal layer 142 may then be deposited and patterned as shown. Layer 142 may consist of doped or undoped aluminum or a first layer of titanium tungsten alloy followed by a layer of CVD tungsten. A second level of metallization may be added after forming an additional insulating layer and making contact vias to selected portions of layer 142 using well known techniques.

As shown in FIG. 25, the resulting BiCMOS structure provides n-channel MOS device 190, p-channel MOS device 192 and a self aligned NPN bipolar transistor 194 on a single semiconductor substrate. The process described provides for the formation of a high performance self aligned bipolar transistor which is merged with a CMOS device structure. By forming the polysilicon emitter in the same lithography step used to form the gate electrodes of the MOS transistors, process simplicity is achieved without sacrificing performance.

Although the invention has been described in detail herein with reference to its preferred embodiment and described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. Such changes and additional embodiments will of course include variations in the implant conditions, oxidation and diffusion cycles, and metallization systems described herein. It is contemplated that all such changes and additional embodiments are within the spirit and scope of the invention as claimed below.

We claim:

1. A method for forming a bipolar transistor and a field effect transistor in the surface of a semiconductor substrate, comprising the steps of:
    forming a collector region of a first conductivity type in a first portion of said substrate;
    forming a base region of a second conductivity type in said collector region;
    forming the emitter region of said bipolar transistor in a layer of semiconductor material doped to said first conductivity type over said base region;
    forming a gate electrode of said field effect transistor in said layer of semiconductor material over a second portion of said substrate;
    forming trenches through at least a portion of said base region at locations adjacent first and second sides of said emitter region;
    forming a sidewall insulator on said portions of said gate electrode, said emitter region and the walls of said trenches to provide a mask for a step of introducing impurities of said second conductivity type; and
    introducing impurities of said second conductivity type in said second portion of said substrate adjacent said gate electrode and in at least one of said trenches adjacent said first side of said emitter region to form the base contact region of said bipolar transistor and the source-drain regions of said field effect transistor.

2. The method of claim 1, further comprising the steps of:

forming a second gate electrode of a second field effect transistor in said layer of semiconductor material over a third portion of said substrate; and introducing impurities of said first conductivity type in said third portion of said substrate adjacent said second gate electrode and in said collector region at a location spaced from said emitter region to form the collector contact region of said bipolar transistor and second source-drain regions of a second field effect transistor.

3. The method of claim 2, wherein said first portion of said substrate comprises an n-doped region, said second portion of said substrate comprises a p-type well region and said third portion of said substrate comprises an n-type well region.

4. The method of claim 1, wherein said semiconductor substrate comprises epitaxial silicon, said first portion of said substrate comprises an n-type doped region, and said second portion of said substrate comprises a p-type doped well region.

5. A method for forming a bipolar transistor and a field effect transistor in the surface of a semiconductor substrate, comprising the steps of:

forming a collector region of a first conductivity type in a first portion of said substrate;

forming a base region of a second conductivity type in said collector region;

forming the emitter region of said bipolar transistor in a layer of semiconductor material doped to said first conductivity type over said base region;

forming a gate electrode of said field effect transistor in said layer of semiconductor material over a second portion of said substrate;

forming trenches through at least a portion of said base region at locations adjacent first and second sides of said emitter region;

forming a first sidewall layer on side portions of said gate electrode, said emitter region, and the walls of said trenches;

introducing impurities of said second conductivity type in said second portion of said substrate adjacent said gate electrode and in at least one of said trenches adjacent said first side of said emitter region to form the base contact region of said bipolar transistor and the source-drain regions of said field effect transistor;

forming a second sidewall layer over a major portion of said first side wall layer; and introducing impurities of said first conductivity type in another one of said trenches adjacent said second side of said emitter region to form the collector contact region of said bipolar transistor said second sidewall layer forming at least a portion of a mask for said step of implanting impurities of said first conductivity type to thereby separate said collector contact region from said base region by a predetermined amount.

6. The method of claim 5, further comprising the steps of:

removing said second sidewall layer; and forming a layer of metal silicide on surface portions of said emitter region, said gate electrode, said source-drain regions, said base contact region and said collector contact region.

7. The method of claim 5, wherein said first sidewall layer comprises oxide and said second sidewall layer comprises polysilicon.

8. A method for forming a bipolar transistor and a field effect transistor in the surface of a semiconductor substrate, comprising the steps of:

forming a collector region of a first conductivity type in a first portion of said substrate, said substrate being of said second conductivity type;

forming a base region of a second conductivity type in said collector region;

forming the emitter region of said bipolar transistor in a layer of semiconductor material doped to said first conductivity type over said base region;

forming a gate oxide;

forming a gate electrode of said field effect transistor in said layer of semiconductor material over a second portion of said substrate and over said gate oxide;

forming trenches through at least a portion of said base region at locations adjacent first and second sides of said emitter region;

forming a first sidewall layer on side portions of said gate electrode, said emitter region, and the walls of said trenches;

introducing impurities of said second conductivity type in said second portion of said substrate adjacent said gate electrode and in at least one of said trenches adjacent said first side of said emitter region to form the base contact region of said bipolar transistor and the source-drain regions of said field effect transistor;

forming a second sidewall layer over a major portion of said first side wall layer; and introducing impurities of said first conductivity type in another one of said trenches adjacent said second side of said emitter region to form the collector contact region of said bipolar transistor said second sidewall layer forming at least a portion of a mask for said step of implanting impurities of said first conductivity type to thereby separate said collector contact region from said base region by a predetermined amount.

* * * * *